United States Patent
Chang et al.

(10) Patent No.: US 9,698,507 B2
(45) Date of Patent: Jul. 4, 2017

(54) PACKAGE STRUCTURE OF POWER MODULE

(71) Applicant: DELTA ELECTRONICS, INC., Taoyuan (TW)

(72) Inventors: Kai-Ti Chang, Taoyuan (TW); Ching-Chi Yang, Taoyuan (TW); Hsueh-Kuo Liao, Taoyuan (TW); Chuna-Jia Cheng, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 31 days.

(21) Appl. No.: 15/003,255

(22) Filed: Jan. 21, 2016

(65) Prior Publication Data

US 2016/0218454 A1    Jul. 28, 2016

(30) Foreign Application Priority Data

Jan. 22, 2015   (TW) .............................. 104102131 A

(51) Int. Cl.
*H05K 5/00* (2006.01)
*H01R 12/70* (2011.01)
*H05K 7/14* (2006.01)

(52) U.S. Cl.
CPC ....... *H01R 12/7076* (2013.01); *H05K 7/1432* (2013.01)

(58) Field of Classification Search
CPC ...... H05K 7/10; H05K 7/1069; H05K 7/1432; H01L 23/48; H01L 23/50; H01L 23/498
USPC .......... 361/759, 764; 439/71, 331; 257/690, 257/723
See application file for complete search history.

(56) References Cited

U.S. PATENT DOCUMENTS

| 4,395,084 A * | 7/1983 | Conrad | H05K 7/1069 29/884 |
| 4,461,524 A * | 7/1984 | McGhee | H05K 7/1069 29/884 |
| 6,853,559 B2 * | 2/2005 | Panella | H01L 23/49805 257/690 |
| 2002/0136501 A1 * | 9/2002 | Yen | G02B 6/4292 385/88 |
| 2003/0193791 A1 * | 10/2003 | Panella | H01L 23/49805 361/764 |
| 2004/0023526 A1 * | 2/2004 | Shimada | H01R 12/7076 439/70 |

* cited by examiner

Primary Examiner — Xiaoliang Chen
(74) Attorney, Agent, or Firm — Kirton McConkie; Evan R. Witt

(57) ABSTRACT

A package structure of a power module includes an insulation frame, a first circuit substrate, an insulation cover, plural first pins, plural posts and a fastening element. The insulation frame includes a sidewall and a first coupling part. The first coupling part is externally protruded from the sidewall. The first coupling part includes a first mounting structure. The first circuit substrate is combined with a bottom part of the insulation frame. The insulation cover is combined with a top part of the insulation frame. The insulation cover includes a second coupling part. The second coupling part includes a second mounting structure. The plural posts are embedded in the at least one first coupling part of the insulation frame, and partially penetrated through the second coupling part. The fastening element is connected with the first mounting structure and the second mounting structure.

13 Claims, 5 Drawing Sheets

PACKAGE STRUCTURE OF POWER MODULE

FIELD OF THE INVENTION

The present invention relates to a package structure, and more particularly to a package structure of a power module.

BACKGROUND OF THE INVENTION

Recently, the general trends in designing electronic devices are toward high density, high performance, small size, light weightiness and portability. With the increasing development of electronic industries, the internal circuitries of the electronic devices are gradually modularized. In other words, plural electronic components are integrated into a single circuit module. For example, a power module is one of the widely-used circuit modules. An example of the power module includes a DC-to-DC converter, a DC-to-AC converter, an AC-to-DC converter, or the like. After the electronic components (e.g. capacitors, resistors, inductors, transformers, diodes and transistors) are integrated as a power module, the power module may be installed on a system circuit board.

An intelligent power module (IPM) is widely used in an intelligent motor driving circuit of an electrical appliance or an industrial appliance. In a conventional package structure of the intelligent power module, electronic components are supported by a lead frame and packaged by an encapsulation material. However, the process of fabricating this package structure is complicated. Moreover, the heat-dissipating efficiency of the package structure is usually insufficient, and the package structure is readily broken. In another conventional package structure of the intelligent power module, a printed circuit board with electronic components is directly disposed within a case, and covered by a covering member. Moreover, the case and the covering member are combined together via an adhesive. However, this package structure still has some drawbacks. For example, since the covering member cannot be securely fixed on the case through the adhesive. Moreover, when the package structure is combined with other device such as a heat sink, the bottom side of the case is easily suffered from bending and deformation because of the stress transmitted from the device. Since the package structure cannot be in close contact with the heat sink, the heat-dissipating efficiency is impaired, or even the package structure is detached from the heat sink. Under this circumstance, the use of the power module is not safe.

Therefore, there is a need of providing an improved package structure in order to overcome the above drawbacks.

SUMMARY OF THE INVENTION

An object of the present invention provides a package structure of a power module for minimizing the possibility of bending or deforming a circuit substrate in response to a stress. Moreover, the package structure is tightly attached on a heat sink in order to enhance the heat-dissipating efficiency.

Another object of the present invention provides a package structure of an intelligent power module, which can be electrically connected with the system circuit board and fixed on the system circuit board. Moreover, the foreign dust or water is prevented from being introduced into the package structure.

In accordance with an aspect of the present invention, there is provided a package structure of a power module. The package structure includes an insulation frame, a first circuit substrate, an insulation cover, plural first pins, plural posts and at least one fastening element. The insulation frame includes a sidewall, a first opening end, a second opening end and at least one first coupling part. The at least one first coupling part is externally protruded from the sidewall. The first coupling part includes a first mounting structure. The first circuit substrate is combined with a bottom part of the insulation frame. The first opening end is covered by the first circuit substrate. The insulation cover is combined with a top part of the insulation frame. The second opening end is covered by the insulation cover. An accommodation space is defined by the insulation cover, the insulation frame and the first circuit substrate collaboratively. The insulation cover includes a strut and at least one second coupling part. The strut is protruded from a bottom surface of the insulation cover and located near the first circuit substrate or contacted with the first circuit substrate. The at least one second coupling part is aligned with the at least one first coupling part of the insulation frame. The second coupling part includes a second mounting structure. The plural first pins are electrically connected with the first circuit substrate. The plural first pins are embedded in the sidewall of the insulation frame and partially penetrated through the insulation cover. The plural posts are embedded in the at least one first coupling part of the insulation frame, and partially penetrated through the at least one second coupling part of the insulation cover. The at least one fastening element is connected with the first mounting structure of the insulation frame and the second mounting structure of the insulation cover, so that the insulation frame and the insulation cover are combined together.

The above contents of the present invention will become more readily apparent to those ordinarily skilled in the art after reviewing the following detailed description and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1A:
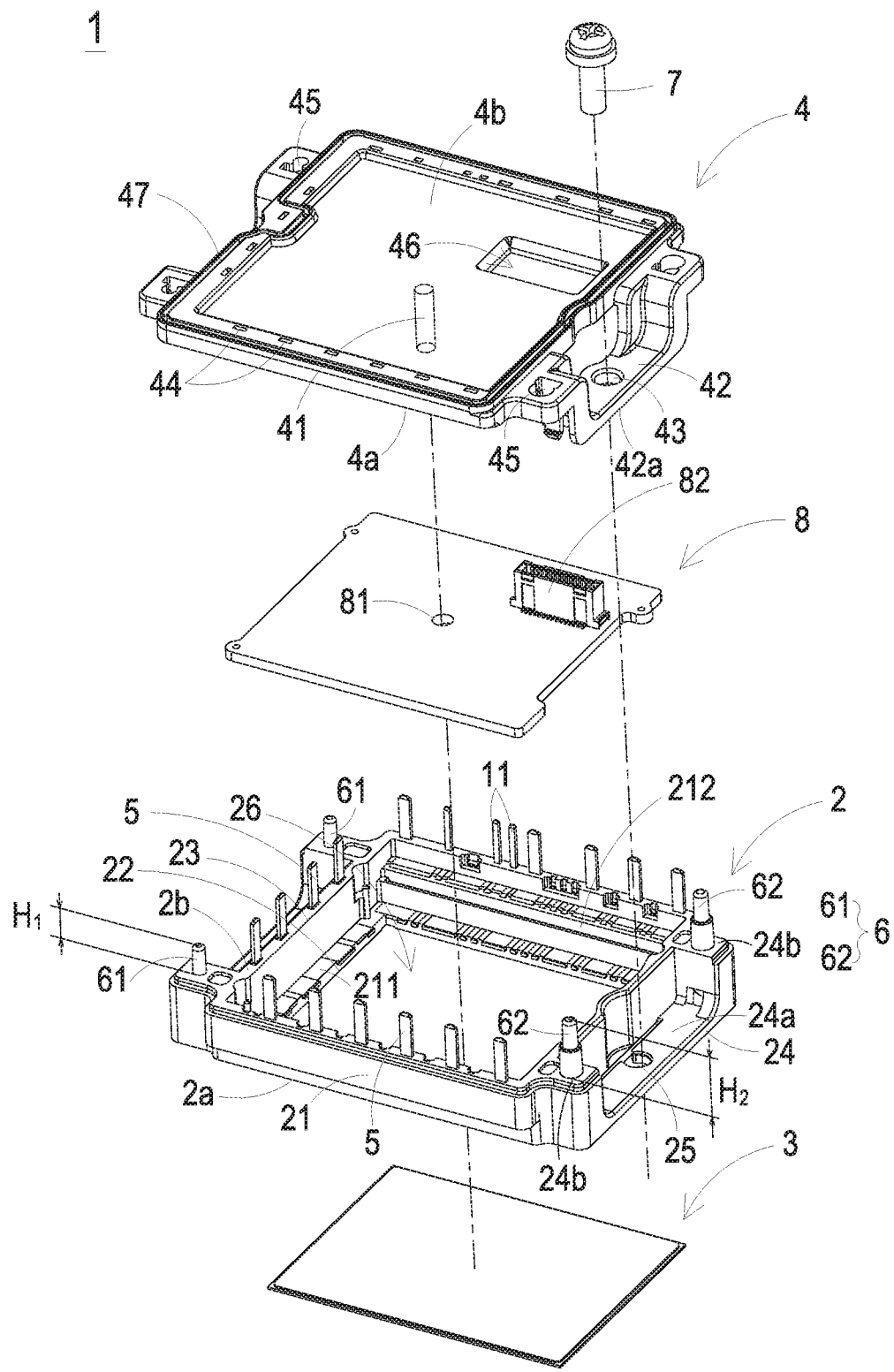
FIG. 1A is a schematic exploded view illustrating a package structure of a power module according to an embodiment of the present invention.
Figure 1B:
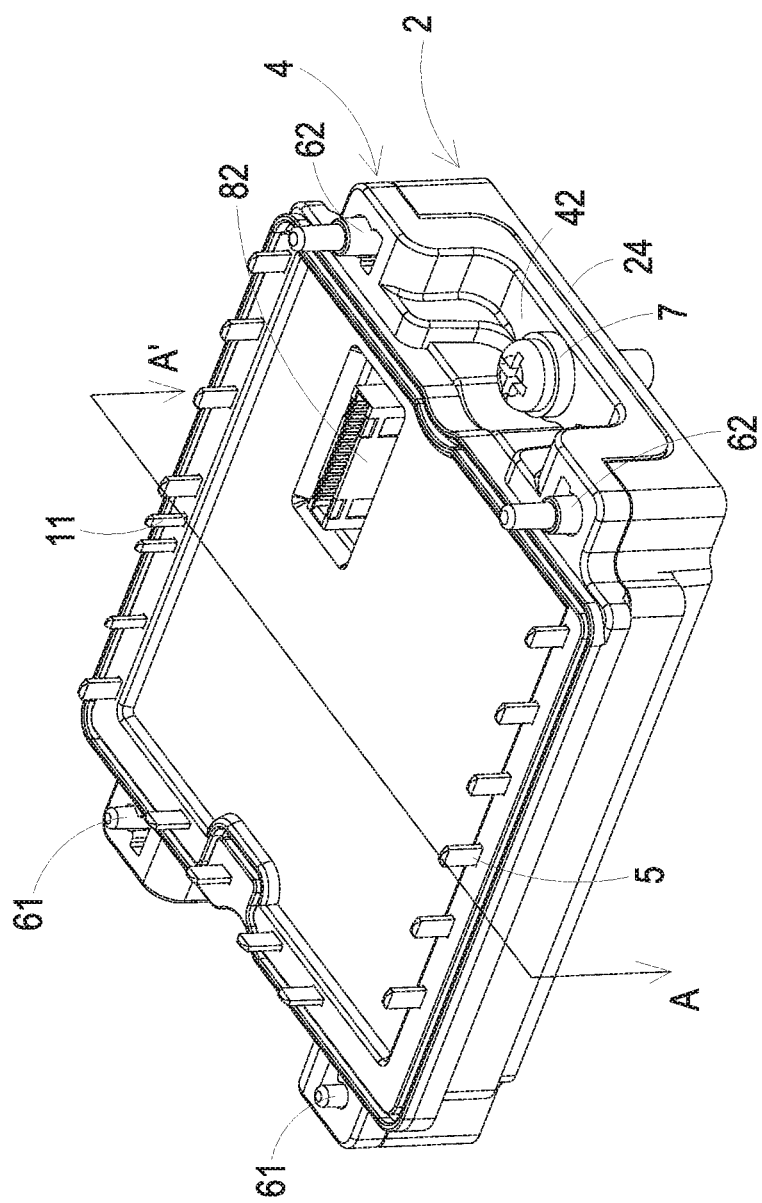
FIG. 1B is a schematic assembled view illustrating the package structure of FIG. 1A.
Figure 1C:
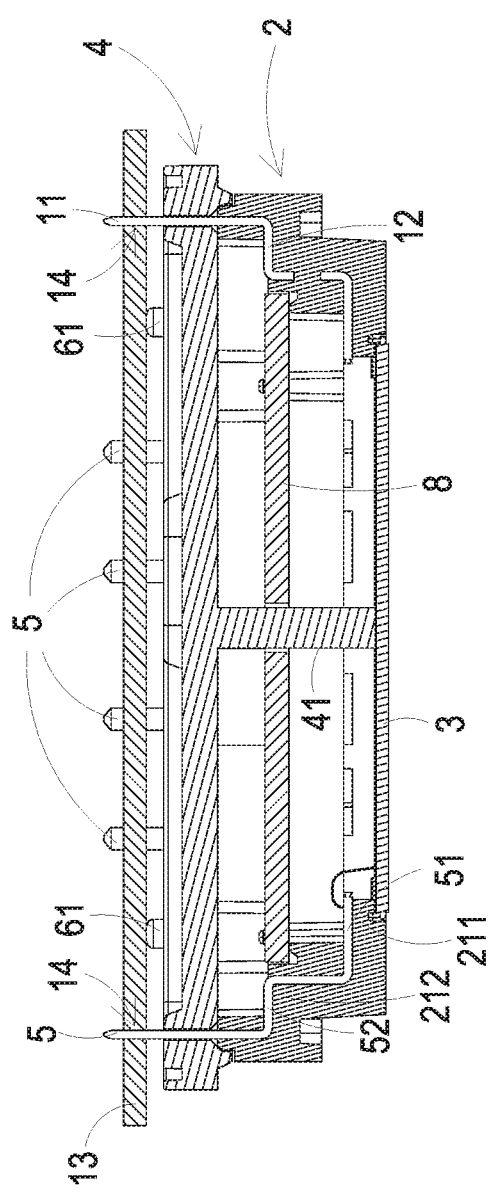
FIG. 1C is a schematic cross-sectional view illustrating the combination of the power module of FIG. 1B and a system circuit board and taken along the line A-A'.

FIG. 1A is a schematic exploded view illustrating a package structure of a power module according to an embodiment of the present invention. FIG. 1B is a schematic assembled view illustrating the package structure of FIG. 1A. FIG. 1C is a schematic cross-sectional view illustrating the combination of the power module of FIG. 1B and a system circuit board and taken along the line A-A'. Preferably but not exclusively, the power module of the present invention is an intelligent power module. In this embodiment, the package structure 1 of the power module comprises an insulation frame 2, a first circuit substrate 3, an insulation cover 4, plural first pins 5, plural posts 6 and at least one fastening element 7.

The insulation frame 2 comprises a bottom part 2a, a top part 2b, a sidewall 21, a first opening end 22, a second opening end 23 and at least one first coupling part 24. The first coupling part 24 is externally protruded from the sidewall 21. Moreover, the first coupling part 24 comprises a first mounting structure 25. The first circuit substrate 3 is combined with the bottom part 2a of the insulation frame 2, and the first opening end 22 is covered by the first circuit substrate 3. The insulation cover 4 is combined with the top part 2b of the insulation frame 2, and the second opening end 23 is covered by the insulation cover 4. Moreover, an accommodation space 26 is defined by the insulation cover 4, the insulation frame 2 and the first circuit substrate 3 collaboratively. In this embodiment, the insulation cover 4 comprises a strut 41 and at least one second coupling part 42. The strut 41 is protruded from a bottom surface 4a of the insulation cover 4. Moreover, the strut 41 is located near the first circuit substrate 3 or contacted with the first circuit substrate 3. The second coupling part 42 is aligned with the first coupling part 24 of the insulation frame 2. Moreover, the second coupling part 42 has a second mounting structure 43. The plural first pins 5 are electrically connected with the first circuit substrate 3. Moreover, the first pins 5 are embedded in the sidewall 21 of the insulation frame 2, and partially penetrated through the insulation cover 4. The plural posts 6 are embedded in the first coupling part 24 of the insulation frame 2, and partially penetrated through the second coupling part 42 of the insulation cover 4. The at least one fastening element 7 is connected with the first mounting structure 25 of the insulation frame 2 and the second mounting structure 43 of the insulation cover 4. Consequently, the insulation frame 2 and the insulation cover 4 are combined together.

In this embodiment, the first coupling part 24 of the insulation frame 2 matches the second coupling part 42 of the insulation cover 4, and the first mounting structure 25 of the first coupling part 24 of the insulation frame 2 matches the second mounting structure 43 of the second coupling part 42 of the insulation cover 4. The first coupling part 24 of the insulation frame 2 has a concave structure 24a, and the second coupling part 42 of the insulation cover 4 has a convex structure 42a. The concave structure 24a and the convex structure 42a are engaged with each other. Consequently, the first coupling part 24 and the second coupling part 42 are coupled with each other. The first coupling part 24 further comprises two coupling seats 24b. The two coupling seats 24b are located at two opposite sides of the concave structure 24a, respectively. Moreover, one post 6 is embedded in one corresponding coupling seat 24b. In this embodiment, the first mounting structure 25 and the second mounting structure 43 are mounting holes. For combining the insulation frame 2 with the insulation cover 4, the first mounting structure 25 of the first coupling part 24 of the insulation frame 2 and the second mounting structure 43 of the second coupling part 42 of the insulation cover 4 are aligned with each other. After the fastening element 7 is penetrated through the first mounting structure 25 and the second mounting structure 43, the insulation frame 2 and the insulation cover 4 are securely combined together. When the insulation frame 2 and the insulation cover 4 are securely combined together, the strut 41 protruded from the bottom surface 4a of the insulation cover 4 is located near the first circuit substrate 3 or contacted with the first circuit substrate 3. Consequently, even if the connecting stress generated from the connection between the insulation frame 2 and the insulation cover 4 is transmitted from the fastening element 7 to the first circuit substrate 3, the strut 41 close to or in contact with the first circuit substrate 3 can maintain the planar status of the first circuit substrate 3. Under this circumstance, the possibility of bending or deforming the first circuit substrate 3 will be minimized.

Please refer to FIGS. 1A, 1B and 1C again. In some embodiments, the package structure 1 of the power module further comprises a second circuit substrate 8. The second circuit substrate 8 is disposed on the insulation frame 2 and accommodated within the accommodation space 26. The second circuit substrate 8 has a through hole 81 corresponding to the strut 41 of the insulation cover 4. After the strut 41 is penetrated through the through hole 81 of the second circuit substrate 8, the strut 41 is located near the first circuit substrate 3 or contacted with the first circuit substrate 3. Preferably but not exclusively, the second circuit substrate 8 is fixed in the insulation frame 2 by a screwing means, a coupling means or an adhesive.

In this embodiment, a first step structure 211 and a second step structure 212 are formed on an inner surface of the sidewall 21 of the insulation frame 2. That is, the first step structure 211 and the second step structure 212 are step structures that are protruded from the inner surface of the sidewall 21 of the insulation frame 2. The first step structure 211 is located near the first opening end 22. The second step structure 212 is arranged between the first step structure 211 and the second opening end 23. The second circuit substrate 8 is supported by the second step structure 212.

The plural first pins 5 are multi-step pins. Each of the first pins 5 comprises a first conductive segment 51 and a second conductive segment 52. The first conductive segment 51 and the second conductive segment 52 are exposed to the first step structure 211 and the second step structure 212, respectively. Preferably but not exclusively, the first circuit substrate 3 is connected with the first conductive segments 51 of the plural first pins 5 through bonding wires. In some embodiments, the package structure 1 of the power module further comprises plural second pins 11. The second pins 11 are embedded in the sidewall 21 of the insulation frame 2, and partially penetrated through the insulation cover 4. Each of the plural second pins 11 comprises a third conductive segment 12. The third conductive segment 12 is exposed to the second step structure 212, and electrically connected with the second circuit substrate 8. Moreover, according to the practical requirements, the second circuit substrate 8 is electrically connected with the first pins 5.

The first circuit substrate 3 is combined with the bottom part 2a of the insulation frame 2, and aligned with the first opening end 22 of the insulation frame 2. Preferably but not exclusively, the first circuit substrate 3 is combined with the bottom part 2a of the insulation frame 2 by a screwing means, a coupling means or an adhesive. The insulation cover 4 comprises plural first perforations 44 and plural second perforations 45. The plural first perforations 44 are aligned with the plural first pins 5 and the plural second pins 11. That is, the plural first pins 5 and the plural second pins 11 are penetrated through the corresponding first perforations 44 of the insulation cover 4. The plural second perforations 45 are aligned with the corresponding posts 6. That is, the posts 6 on the first coupling parts 24 are penetrated through the corresponding second perforations 45 of the second coupling part 42 of the insulation cover 4.

Please refer to FIGS. 1A and 1B again. In an embodiment, the insulation cover 4 further comprises a third opening end 46, and a connector 82 is disposed on the second circuit substrate 8. The position and size of the third opening end 46 match the connector 82. Consequently, after the connector 82 is partially penetrated through the third opening end 46 of the insulation cover 4, the connector 82 is electrically connected with an external system circuit board (not shown). Preferably but not exclusively, the connector 82 is fixed on the second circuit substrate 8 by a press-fit process.

In an embodiment, the plural posts 6 include plural single-step posts 61 and two-step posts 62. The single-step 61 has a first height H1 with respect to the first coupling part 24. The two-step post 62 has a second height H2 with respect to the first coupling part 24. The second height H2 of the two-step post 62 is larger than the first height H1 of the single-step 61. Moreover, as shown in FIG. 1C, the package structure 1 of the power module is installed on and electrically connected with a system circuit board 13. The system circuit board 13 comprises plural conductive holes 14 and plural positioning holes (not shown). The plural conductive holes 14 are aligned with the corresponding first pins 5 and the corresponding second pins 11. The plural fixing holes are aligned with the corresponding two-step posts 62. In particular, the plural first pins 5 and the plural second pins 11 are inserted into the corresponding conductive holes 14 of the system circuit board 13, and the plural two-step posts 62 are inserted into the corresponding positioning holes of the system circuit board 13. Consequently, the package structure 1 of the power module can be electrically connected with the system circuit board 13 and fixed on the system circuit board 13.

Figure 2:
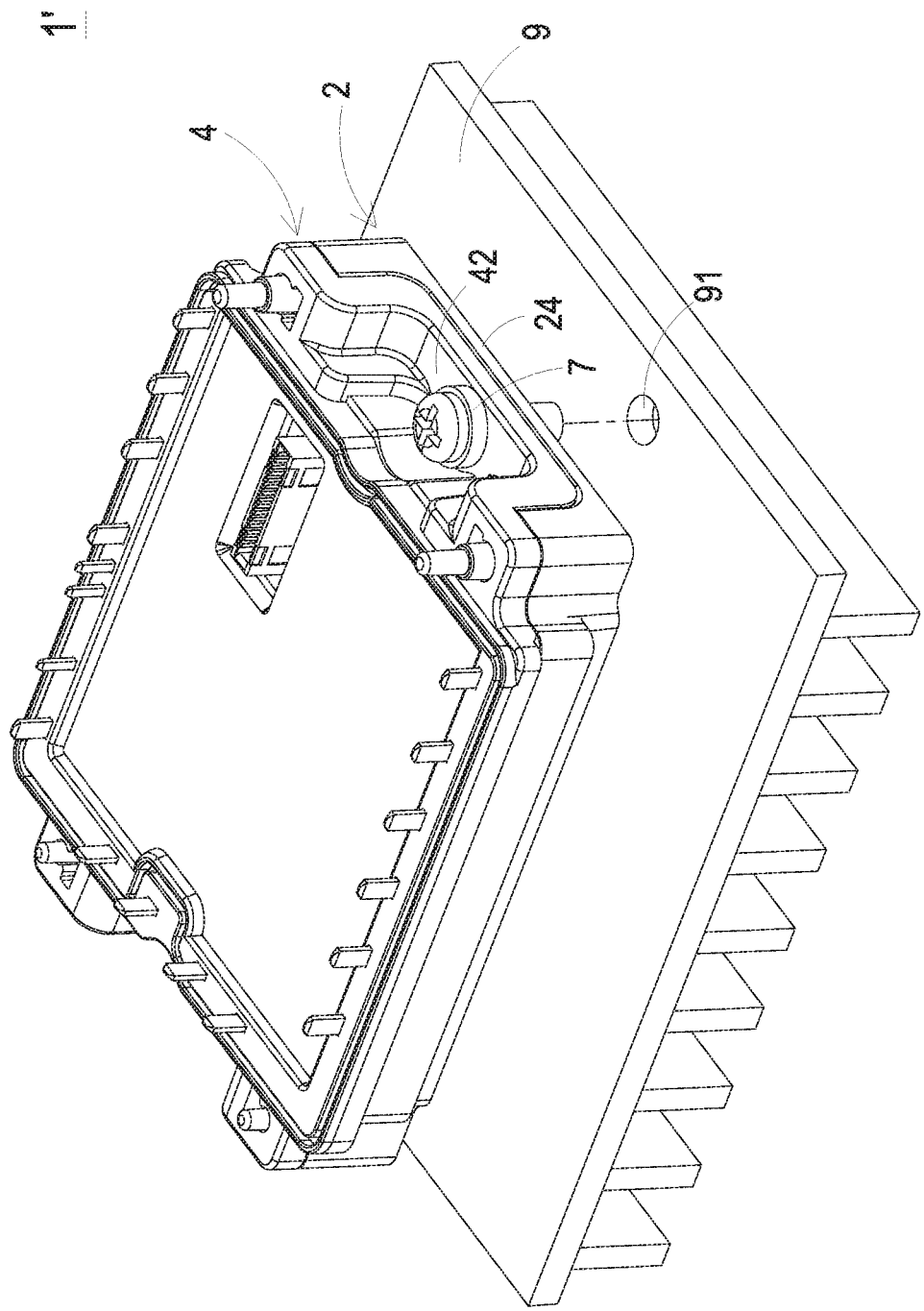
FIG. 2 is a schematic assembled view illustrating a variant example of the package structure of FIG. 1A.

FIG. 2 is a schematic assembled view illustrating a variant example of the package structure of FIG. 1A. Please refer to FIGS. 1A and 2. In comparison with the package structure of FIG. 1A, the package structure 1' of this embodiment further comprises a heat sink 9. The heat sink 9 comprises a third mounting structure 91 corresponding to the first mounting structure 25 of the insulation frame 2. For example, the third mounting structure 91 is a mounting hole. After the insulation frame 2, the first circuit substrate 3 and the insulation cover 4 are combined together, the fastening element 7 is penetrated through the first mounting structure 25 of the insulation frame 2 and the second mounting structure 43 of the insulation cover 4 and tightened into the third mounting structure 91 of the heat sink 9. Consequently, the combination of the insulation frame 2, the first circuit substrate 3 and the insulation cover 4 is fixed on the heat sink 9. Under this circumstance, the insulation frame 2, the insulation cover 4 and the heat sink 9 are securely combined with each other. Consequently, the heat-dissipating efficiency is enhanced.

Figure 3:
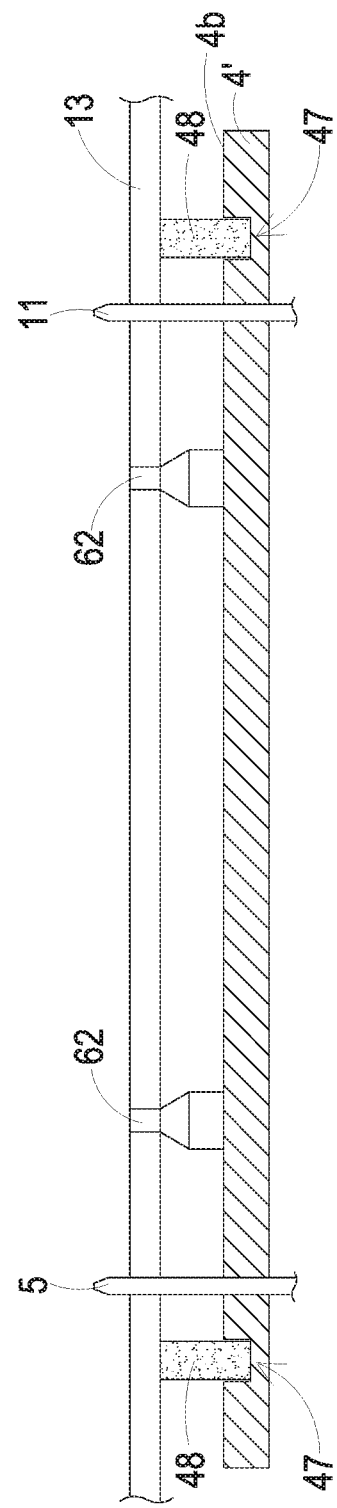
FIG. 3 is a schematic partial cross-sectional view illustrating the combination of the power module and a system circuit board according to another embodiment of the present invention.

It is noted that numerous modifications and alterations may be made while retaining the teachings of the invention. FIG. 3 is a schematic partial cross-sectional view illustrating the combination of the power module and a system circuit board according to another embodiment of the present invention. Please refer to FIGS. 1A, 1B, 1C and 3. In comparison with FIG. 1C, the insulation cover 4' of this embodiment further comprises a groove 47, a washer 48 and a top surface 4b. The groove 47 is formed in the top surface 4b of the insulation cover 4'. Moreover, the groove 47 is located at the peripheral region of the insulation cover 4' and arranged around the first pins 5 and the second pins 11. The washer 48 is disposed in the groove 47 and arranged between the insulation cover 4' and the system circuit board 13. Preferably but not exclusively, the washer 48 is made of an elastic, insulated and waterproof material such as rubber. When the package structure 1 of the power module is combined with the system circuit board 13, the washer 48 in the groove 47 is compressed by the system circuit board 13 over the insulation cover 4'. Since the compressed washer 48 is in close contact with the system circuit board 13, the foreign dust or water is prevented from being introduced into the space between the insulation cover 4' and the system circuit board 13. Under this circumstance, the first pins 5 and the second pins 11 are not adversely affected by the foreign dust or water.

From the above descriptions, the present invention provides the package structure of the power module. The insulation frame and the insulation cover are securely combined together through the connection between the first mounting structure and the second mounting structure. When the insulation frame and the insulation cover are securely combined together, the strut is located near the first circuit substrate or contacted with the first circuit substrate. Consequently, even if the connecting stress is transmitted to the first circuit substrate, the possibility of bending or deforming the first circuit substrate will be minimized. Moreover, the single-step posts and the two-step posts can facilitate positioning the package structure on the system circuit board. Moreover, the package structure can be electrically connected with the system circuit board and fixed on the system circuit board. Since the compressed washer is in close contact with the system circuit board, the foreign dust or water is prevented from being introduced into the space between the insulation cover and the system circuit board. Under this circumstance, the pins are not adversely affected by the foreign dust or water.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A package structure of a power module, the package structure comprising:
   an insulation frame comprising a sidewall, a first opening end, a second opening end and at least one first coupling part, wherein the at least one first coupling part is externally protruded from the sidewall, and the first coupling part comprises a first mounting structure;
   a first circuit substrate combined with a bottom part of the insulation frame, wherein the first opening end is covered by the first circuit substrate;
   an insulation cover combined with a top part of the insulation frame, wherein the second opening end is covered by the insulation cover, and an accommodation space is defined by the insulation cover, the insulation frame and the first circuit substrate collaboratively, wherein the insulation cover comprises a strut and at least one second coupling part, wherein the strut is protruded from a bottom surface of the insulation cover and located near the first circuit substrate or contacted with the first circuit substrate, wherein the at least one second coupling part is aligned with the at least one first coupling part of the insulation frame, and the second coupling part comprises a second mounting structure;

plural first pins electrically connected with the first circuit substrate, wherein the plural first pins are embedded in the sidewall of the insulation frame and partially penetrated through the insulation cover;

plural posts embedded in the at least one first coupling part of the insulation frame, and partially penetrated through the at least one second coupling part of the insulation cover; and at least one fastening element connected with the first mounting structure of the insulation frame and the second mounting structure of the insulation cover, so that the insulation frame and the insulation cover are combined together.

2. The package structure according to claim 1, wherein the first coupling part matches the second coupling part, and the first mounting structure corresponds to the second mounting structure.

3. The package structure according to claim 1, further comprising a second circuit substrate, wherein the second circuit substrate is disposed on the insulation frame and accommodated within the accommodation space.

4. The package structure according to claim 3, wherein the insulation cover further comprises a third opening end, and a connector is disposed on the second circuit substrate, wherein the connector is partially penetrated through the third opening end of the insulation cover.

5. The package structure according to claim 3, wherein the second circuit substrate has a through hole corresponding to the strut of the insulation cover, wherein the strut is penetrated through the through hole of the second circuit substrate.

6. The package structure according to claim 3, wherein the insulation frame further comprises:

a first step structure formed on an inner surface of the sidewall of the insulation frame, and located near the first opening end; and a second step structure formed on the inner surface of the sidewall of the insulation frame, and arrange between the first step structure and the second opening end, wherein the second circuit substrate is supported by the second step structure.

7. The package structure according to claim 6, wherein each of the plural first pins is a multi-step pin and comprises a first conductive segment and a second conductive segment, wherein the first conductive segment and the second conductive segment are respectively exposed to the first step structure and the second step structure of the insulation frame.

8. The package structure according to claim 6, further comprising plural second pins, wherein the plural second pins are embedded in the sidewall of the insulation frame and partially penetrated through the insulation cover, wherein each of the plural second pins comprises a third conductive segment, and the third conductive segment is exposed to the second step structure.

9. The package structure according to claim 1, wherein the plural posts include plural single-step posts and plural two-step posts, wherein each single-step post has a first height with respect to the first coupling part, and each two-step post has a second height with respect to the first coupling part, wherein the second height is larger than the first height.

10. The package structure according to claim 9, wherein the insulation cover comprises plural first perforations and plural second perforations, wherein the plural first pins are penetrated through the corresponding first perforations, and the two-step posts are penetrated through the corresponding second perforations.

11. The package structure according to claim 9, wherein the package structure is installed on a system circuit board and electrically connected with the system circuit board, wherein the system circuit board comprises plural conductive holes and plural positioning holes, wherein the plural first pins are inserted into the corresponding conductive holes, and the plural two-step posts are inserted into the corresponding positioning holes.

12. The package structure according to claim 1, wherein the insulation cover further comprises a groove, a washer and a top surface, wherein the groove is formed in the top surface of the insulation cover and arranged around the plural first pins, wherein the washer is disposed in the groove.

13. The package structure according to claim 1, further comprising a heat sink, wherein the heat sink comprises a third mounting structure corresponding to the first mounting structure of the insulation frame, wherein the fastening element is connected with the first mounting structure of the insulation frame, the second mounting structure of the insulation cover and the third mounting structure of the heat sink.

* * * * *